United States Patent
Teramoto

(10) Patent No.: US 9,882,542 B2
(45) Date of Patent: Jan. 30, 2018

(54) FILTER COMPONENT

(71) Applicant: Murata Manufacturing Co., Ltd., Nagaokakyo-shi, Kyoto-fu (JP)

(72) Inventor: Masahiro Teramoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/171,184

(22) Filed: Jun. 2, 2016

(65) Prior Publication Data

US 2016/0276997 A1 Sep. 22, 2016

Related U.S. Application Data

(63) Continuation of application No. PCT/JP2014/082376, filed on Dec. 8, 2014.

(30) Foreign Application Priority Data

Dec. 12, 2013 (JP) ................................ 2013-256690

(51) Int. Cl.
*H03H 7/42* (2006.01)
*H03H 7/01* (2006.01)
(Continued)

(52) U.S. Cl.
CPC ........ *H03H 7/0115* (2013.01); *H03H 7/1758* (2013.01); *H03H 7/1766* (2013.01);
(Continued)

(58) Field of Classification Search
CPC ...... H03H 7/0115; H03H 7/075; H03H 7/427; H03H 2001/0085; H03H 7/19;
(Continued)

(56) References Cited

U.S. PATENT DOCUMENTS

| 7,403,403 | B2 * | 7/2008 | Saitoh | .................... | H02M 1/44 333/181 |
| 2002/0030562 | A1 * | 3/2002 | Takada | ................. | H03H 7/0115 333/185 |

(Continued)

FOREIGN PATENT DOCUMENTS

| JP | 3-80708 A | 4/1991 |
| JP | 11-68497 A | 3/1999 |
| JP | 2006-287427 A | 10/2006 |
| JP | 2010-154435 A | 7/2010 |

(Continued)

OTHER PUBLICATIONS

Official Communication issued in International Application PCT/JP2014/082376, dated Feb. 10, 2015.

*Primary Examiner* — Benny Lee
*Assistant Examiner* — Jorge Salazar, Jr.
(74) *Attorney, Agent, or Firm* — Keating & Bennett, LLP

(57) ABSTRACT

In a filter component with improved attenuation characteristics for common mode noise, an LC series resonance circuit disposed in each of a plurality of shunt circuits is connected at a first end to a first line and is grounded at a second end. The LC series resonance circuit disposed in each of the shunt circuits is grounded at a first end and is connected at a second end to a second line. With this configuration, the LC series resonance circuits resonate reliably so as to define attenuation poles. Accordingly, the resonant frequency of each of the LC series resonance circuits is set to be a frequency that effectively attenuates common mode noise.

14 Claims, 10 Drawing Sheets

(51) Int. Cl.
 *H03H 7/075* (2006.01)
 *H03H 1/00* (2006.01)

(52) U.S. Cl.
 CPC ............. *H03H 7/427* (2013.01); *H03H 7/075* (2013.01); *H03H 2001/0085* (2013.01); *H03H 2007/013* (2013.01)

(58) Field of Classification Search
 CPC .... H03H 7/175; H03H 7/1791; H03H 7/1766; H03H 2007/013; H03H 7/1758
 USPC .................. 333/175, 4, 5, 167, 181, 185
 See application file for complete search history.

(56) References Cited

U.S. PATENT DOCUMENTS

| | | |
|---|---|---|
| 2006/0220972 A1 | 10/2006 | Saitoh |
| 2012/0098620 A1* | 4/2012 | Tseng ................... H03H 7/0115 333/175 |
| 2015/0349739 A1* | 12/2015 | Wu ....................... H03H 7/0115 333/170 |

FOREIGN PATENT DOCUMENTS

| | | |
|---|---|---|
| JP | 2011-228824 A | 11/2011 |
| JP | 2012-19443 A | 1/2012 |

\* cited by examiner

FILTER COMPONENT

BACKGROUND OF THE INVENTION

1. Field of the Invention

The present invention relates to a filter component that eliminates common mode noise which propagates through differential lines, and more particularly, to a technology that improves attenuation characteristics of the filter component.

2. Description of the Related Art

A known filter component includes a filter circuit for eliminating common mode noise which propagates through differential lines. As shown in the circuit diagram in FIG. 19, in a known filter component 500, passive series elements 504a and 504b are respectively connected in series with first and second lines 503a and 503b disposed between first and second differential input terminals 501a and 501b and first and second differential output terminals 502a and 502b, respectively, and a passive parallel element 505 is connected in parallel between the first and second lines 503a and 503b, thus forming a ladder differential four-terminal circuit.

More specifically, on the first line 503a between the first differential input and output terminals 501a and 502a, two inductors Lo/2 are connected in series with each other as the passive series element 504a so that they are positively coupled with each other. On the second line 503b between the second differential input and output terminals 501b and 502b, two inductors Lo/2 are connected in series with each other as the passive series element 504b so that they are positively coupled with each other. One of two capacitors Co which are connected in series with each other as the passive parallel element 505 is connected to a portion at which the two inductors Lo/2 are connected in series with each other on the first line 503a. The other one of the two capacitors Co which are connected in series with each other as the passive parallel element 505 is connected to a portion at which the two inductors Lo/2 are connected in series with each other on the second line 503b.

A bridge capacitance Ca is connected between the two terminals of the two inductors Lo/2 connected in series with each other on the first line 503a. A bridge capacitance Ca is connected between the two terminals of the two inductors Lo/2 connected in series with each other on the second line 503b. With this configuration, in the above-described ladder differential four-terminal circuit, a bridged-T all-pass differential delay line is formed. An inductor Lc for attenuating common mode noise is connected between a ground potential and a node T between the two capacitors Co which are connected to the first and second lines 503a and 503b as the passive parallel element, thus forming a differential delay line common mode filter.

Reference signs +vd and −vd shown near the first and second differential input terminals 501a and 501b in FIG. 19 denote a power difference for impedance Zo, a reference sign Zo near the first and second differential output terminals 502a and 502b denotes a terminating impedance, and a reference sign vc denotes a common mode noise source. In the filter component 500, the above-described common mode filter may be disposed in plural in a ladder form on the first and second lines 503a and 503b which are respectively disposed between the first and second differential input terminals 501a and 501b and the first and second differential output terminals 502a and 502b.

In the common mode filter included in the above-described filter component 500, an attenuation pole for attenuating common mode noise is formed by an LC series resonance circuit constituted by the inductor Lc for attenuating common mode noise and the capacitors Co connected as the passive parallel element 505. Differential lines (Differential signals) propagating through the first and second lines 503a and 503b are signals out of phase with each other by 180°. Accordingly, in a case in which the node T between the two capacitors Co which connect the first and second lines 503a and 503b with each other is set at a midpoint between the first and second lines 503a and 503b, the node T is a virtual ground point.

In this case, the inductor Lc connected to the node T which is grounded virtually does not function sufficiently, and thus, the attenuation characteristics for attenuating common mode noise exhibited by the LC series resonance circuit may be deteriorated. Additionally, since the LC series resonance circuit is formed by the inductor Lc connected to the virtually grounded node T, if the node T is formed at a position displaced from the ideal virtual ground point due to the restrictions of the structure of the filter component 500, the following problem may occur. A phase shift occurs in the common mode noise, and thus, common mode noise may not be sufficiently attenuated.

SUMMARY OF THE INVENTION

Preferred embodiments of the present invention provide a filter component in which attenuation characteristics for common mode noise are improved.

A filter component according to a preferred embodiment of the present invention includes first and second differential input terminals; first and second differential output terminals; a first filter circuit that is disposed on a first line between the first differential input terminal and the first differential output terminal; a second filter circuit that is disposed on a second line between the second differential input terminal and the second differential output terminal; and a shunt circuit that connects the first line and the second line with each other. The shunt circuit includes a first LC series resonance circuit that is connected at one end to the first line, and a second LC series resonance circuit that is connected at one end to the other end of the first LC series resonance circuit and at the other end to the second line. A node between the first and second LC series resonance circuits is grounded.

The first line between the first differential input terminal and the first differential output terminal and the second line between the second differential input terminal and the second differential output terminal preferably are connected to each other by the shunt circuit. The shunt circuit includes the first LC series resonance circuit connected at one end to the first line and the second LC series resonance circuit connected at one end to the other end of the first LC series resonance circuit and at the other end to the second line. The node between the first and second LC series resonance circuits is grounded. With this configuration, since the first LC series resonance circuit is connected at one end to the first line and is grounded at the other end, it resonates reliably so as to provide an attenuation pole. Since the second LC series resonance circuit is grounded at one end and is connected at the other end to the second line, it resonates reliably so as to provide an attenuation pole.

Accordingly, the resonant frequency of each of the first and second LC series resonance circuits is set to be a frequency that effectively attenuates common mode noise, thus making it possible to reliably attenuate common mode noise. It is thus possible to provide a filter component in which the attenuation characteristics for common mode noise are improved. The first and second LC series resonance circuits resonate regardless of the grounding state of the node between the first and second LC series resonance circuits. Accordingly, it is not necessary to set the node at the midpoint of the shunt circuit, which is a virtual ground point. Hence, it is possible to significantly reduce or prevent variations in the resonant frequency of each of the first and second LC series resonance circuits caused by positional variations of the node between the first and second LC series resonance circuits on the shunt circuit.

The node may be set at a midpoint of the shunt circuit. Inductance of a first inductor included in the first LC series resonance circuit and inductance of a second inductor included in the second LC series resonance circuit may be identical to each other.

With this arrangement, it is possible to further enhance the effect of significantly reducing or eliminating common mode noise in a predetermined frequency band.

The filter component may further include a multilayer substrate including a plurality of insulating layers stacked on each other. The first and second filter circuits and the shunt circuit may be disposed in the multilayer substrate. The first and second filter circuits may be disposed on one side of the multilayer substrate, and the shunt circuit may be disposed on the other side of the multilayer substrate.

With this configuration, the first and second filter circuits are disposed on one side of the multilayer substrate, while the shunt circuit, on which the node between the first and second LC series resonance circuits are grounded, is disposed on the other side of the multilayer substrate. Accordingly, the distance between the first and second filter circuits and a ground electrode which grounds the node of the shunt circuit is able to be set as long as possible within the multilayer substrate. It is thus possible to reduce loss which may be caused by the interference of the ground electrode with magnetic fields generated by a current flowing through the first and second filter circuits. Therefore, loss of a radio frequency (RF) signal passing through the filter component is able to be significantly reduced or prevented.

The first filter circuit may include a first LC parallel resonance circuit, and the second filter circuit may include a second LC parallel resonance circuit.

With this configuration, it is possible to provide a filter component having the following practical configuration. Band elimination filters (BEFs) including the first and second LC parallel resonance circuits are provided in the first and second filter circuits, respectively.

The first filter circuit may include the first LC parallel resonance circuit and a third LC parallel resonance circuit connected in series with the first LC parallel resonance circuit. The second filter circuit may include the second LC parallel resonance circuit and a fourth LC parallel resonance circuit connected in series with the second LC parallel resonance circuit.

With this configuration, it is possible to provide a filter component having the following practical configuration. A low pass filter (LPF) including the first and third LC parallel resonance circuits connected in series with each other is provided in the first filter circuit. An LPF including the second and fourth LC parallel resonance circuits connected in series with each other is provided in the second filter circuit.

The shunt circuit may be disposed: between a previous stage of the first LC parallel resonance circuit and a previous stage of the second LC parallel resonance circuit; between a node between the first and third LC parallel resonance circuits and a node between the second and fourth LC parallel resonance circuits; and between a subsequent stage of the third LC parallel resonance circuit and a subsequent stage of the fourth LC parallel resonance circuit.

With this configuration, it is possible to adjust the attenuation characteristics for common mode noise with higher precision by using the three shunt circuits.

The first and second inductors of one of the three shunt circuits may be disposed on the insulating layer different from the insulating layer on which the first and second inductors of the other shunt circuits are disposed. A flat-shaped ground electrode may be provided on the insulating layer disposed between the insulating layer on which the first and second inductors of one of the three shunt circuits are disposed and the insulating layer on which the first and second inductors of the other shunt circuits are disposed.

The first and second inductors of one of the three shunt circuits are disposed on the insulating layer, which is different from the insulating layer on which the first and second inductors of the other shunt circuits are provided. The flat-shaped ground electrode is disposed between the first and second inductors of one of the three shunt circuits and the first and second inductors of the other shunt circuits. With this configuration, the first and second inductors of the shunt circuits are able to be disposed separately from each other in the in-plane direction of the insulating layer or in the stacking direction of the multilayer substrate. This makes it possible to significantly reduce or prevent unwanted coupling between the inductors and thus to reduce or prevent variations in the characteristics of the LC series resonance circuits.

The node may be grounded via a third inductor.

With this configuration, the node between the first and second LC series resonance circuits of the shunt circuit is grounded via the third inductor. Thus, the attenuation characteristics for common mode noise exhibited by the first and second LC series resonance circuits are able to be adjusted with higher precision by the provision of the third inductor.

Parasitic resistance of the first and second inductors may be greater than parasitic resistance of the third inductor.

By setting the parasitic resistance of the first inductor of the first LC series resonance circuit and the second inductor of the second LC series resonance circuit to be greater in this manner, the Q factor of each of the first and second LC series resonance circuits is decreased, thus making the resonance characteristics less sharp. It is thus possible to widen the frequency range of the attenuation characteristics for common mode noise near the attenuation poles provided by the first and second LC series resonance circuits.

According to various preferred embodiments of the present invention, the first LC series resonance circuit disposed in the shunt circuit is connected at one end to the first line and is grounded at the other end, and the second LC series resonance circuit disposed in the shunt circuit is grounded at one end and is connected at the other end to the second line. With this configuration, the first and second LC series resonance circuits resonate reliably so as to provide attenuation poles. Accordingly, the resonant frequency of each of the first and second LC series resonance circuits is set to be a frequency that effectively attenuates common mode noise, thus making it possible to reliably attenuate common mode noise. It is thus possible to provide a filter component in which the attenuation characteristics for common mode noise are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
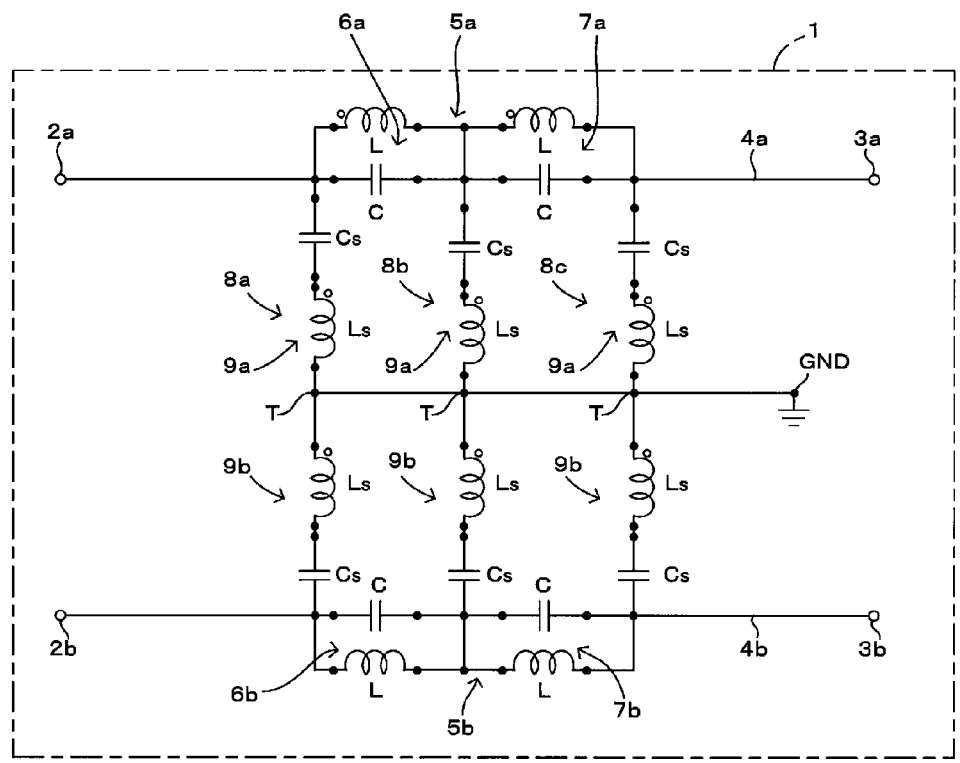
FIG. 1 is a circuit diagram of a filter component according to a first preferred embodiment of the present invention.
Figure 2:
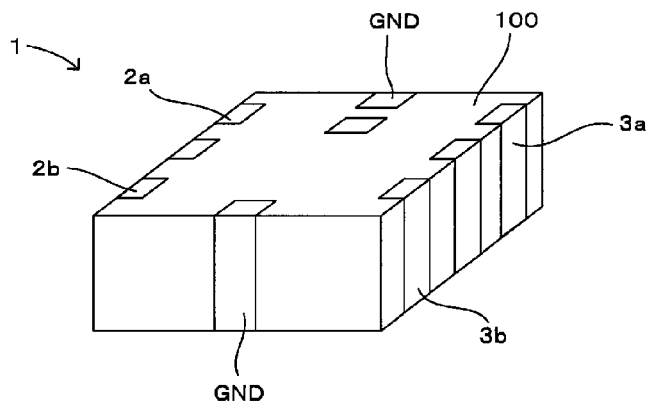
FIG. 2 is an external view of the filter component shown in FIG. 1.
Figure 3:
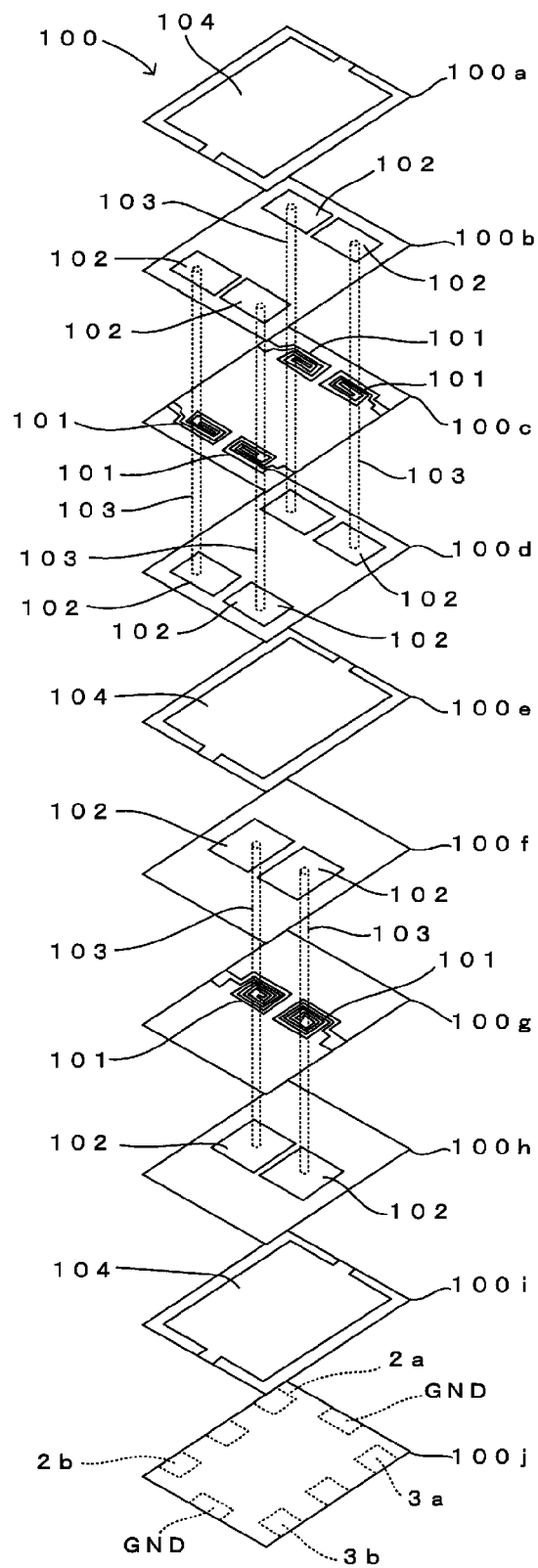
FIG. 3 is an enlarged view of the major portion of the internal portion of the filter component shown in FIG. 2.
Figure 4:
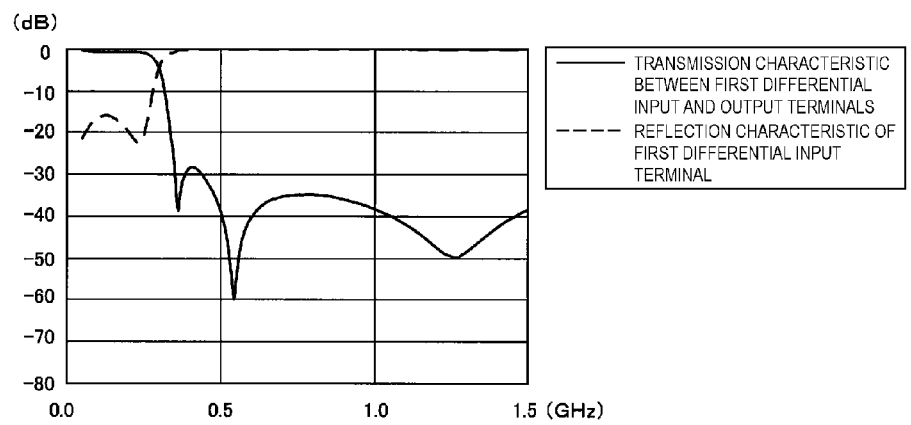
FIG. 4 is a graph illustrating frequency characteristics of the filter component shown in FIG. 1.

A first preferred embodiment of the present invention will be described below with reference to FIGS. 1 through 4. FIG. 1 is a circuit diagram of a filter component according to the first preferred embodiment of the present invention. FIG. 2 is an external view of the filter component shown in FIG. 1. FIG. 3 is an enlarged view of the major portion of the internal portion of the filter component shown in FIG. 2. FIG. 4 is a graph illustrating frequency characteristics of the filter component shown in FIG. 1. In FIG. 3, among layers of a multilayer substrate included in the filter component shown in FIG. 2, only the lower layers of the multilayer substrate in which shunt circuits 8a, 8b, and 8c are disposed are shown.

An overview of the circuit configuration of a filter component 1 will be described below.

The filter component 1 shown in FIG. 1 has a function of eliminating common mode noise which propagates through differential lines. The filter component 1 includes first and second differential input terminals 2a and 2b and first and second differential output terminals 3a and 3b. A first filter circuit 5a is disposed on a first line 4a between the first differential input terminal 2a and the first differential output terminal 3a. A second filter circuit 5b is disposed on a second line 4b between the second differential input terminal 2b and the second differential output terminal 3b.

The first filter circuit 5a includes two LC parallel resonance circuits 6a and 7a connected in series with each other. Each of the LC parallel resonance circuits 6a and 7a includes an inductor L and a capacitor C connected in parallel with each other. In this preferred embodiment, an LPF is provided in the first filter circuit 5a. The second filter circuit 5b includes two LC parallel resonance circuits 6b and 7b connected in series with each other. Each of the LC parallel resonance circuits 6b and 7b includes an inductor L and a capacitor C connected in parallel with each other. In this preferred embodiment, an LPF is provided in the second filter circuit 5b. The LC parallel resonance circuit 6a corresponds to "a first LC parallel resonance circuit". The LC parallel resonance circuit 6b corresponds to "a second LC parallel resonance circuit". The LC parallel resonance circuit 7a corresponds to "a third LC parallel resonance circuit". The LC parallel resonance circuit 7b corresponds to "a fourth LC parallel resonance circuit".

A shunt circuit 8a is disposed between the previous stage of the LC parallel resonance circuit 6a and the previous stage of the LC parallel resonance circuit 6b. A shunt circuit 8b is disposed between the node between the LC parallel resonance circuits 6a and 7a and the node between the LC parallel resonance circuits 6b and 7b. A shunt circuit 8c is disposed between the subsequent stage of the LC parallel resonance circuit 7a and the subsequent stage of the LC parallel resonance circuit 7b. The shunt circuits 8a, 8b, and 8c each connect the first line 4a and the second line 4b with each other. The shunt circuits 8a, 8b, and 8c each include two LC series resonance circuits 9a and 9b, each of which includes an inductor Ls and a capacitor Cs connected in series with each other. The LC series resonance circuits 9a and 9b are connected in series with each other with the inductors Ls connected to each other.

In each of the shunt circuits 8a, 8b, and 8c, one end of the capacitor Cs of the LC series resonance circuit 9a is connected to the first line 4a, and the other end of the capacitor of the LC series resonance circuit 9b is connected to the second line 4b. A node T between the LC series resonance circuits 9a and 9b is grounded via a ground terminal GND. In this preferred embodiment, each of the nodes T is set at a midpoint of corresponding one of the shunt circuits 8a, 8b, and 8c. The inductance of the inductor Ls (corresponding to "a first inductor") of the LC series resonance circuit 9a and the inductance of the inductor Ls (corresponding to "a second inductor") of the LC series resonance circuit 9b are set to be identical to each other. The LC series resonance circuit 9a corresponds to "a first series resonance circuit", and the LC series resonance circuit 9b corresponds to "a second series resonance circuit".

An overview of the configuration of the filter component 1 will be described below.

The filter component 1 includes a multilayer substrate 100 in which the first and second filter circuits 5a and 5b and the shunt circuits 8a, 8b, and 8c are disposed. The multilayer substrate 100 includes a plurality of insulating layers made of ceramic or resin stacked on each other. On the surfaces of the multilayer substrate 100, the first and second differential input terminals 2a and 2b, the first and second differential output terminals 3a and 3b, and ground terminals GND are provided as outer electrodes. The first and second filter circuits 5a and 5b and the shunt circuits 8a, 8b, and 8c are provided within the multilayer substrate 100 by connecting inductor electrodes, capacitor electrodes, and ground electrodes provided on the corresponding insulating layers to each other by using via-conductors.

A terminal located between the first and second differential input terminals 2a and 2b on a side surface of the multilayer substrate 100 and a terminal located between the first and second differential output terminals 3a and 3b on another side surface of the multilayer substrate 100 are no connection (NC) terminals. A square-shaped mark on the top surface of the multilayer substrate 100 is a mark used to check the orientation of the filter component 1.

In this preferred embodiment, the first and second filter circuits 5a and 5b are disposed on one side of the multilayer substrate 100, which is the upper portion of the multilayer substrate 100 in FIG. 2, while the shunt circuits 8a, 8b, and 8c are disposed on the other side of the multilayer substrate 100, which is the lower portion of the multilayer substrate 100 in FIG. 2. As shown in FIG. 3, inductor electrodes 101 defining the inductors Ls of the shunt circuits 8a and 8c are provided on an insulating layer 100c, while capacitor electrodes 102 defining the capacitors Cs of the shunt circuits 8a and 8c are provided on insulating layers 100b and 100d immediately above and below the insulating layer 100c. The inductor electrodes 101 and the capacitor electrodes 102 defining the shunt circuits 8a and 8c are connected to each other by using via-conductors 103. Another insulating layer may be disposed between the insulating layer 100c on which the inductor electrodes 101 are provided and the insulating layer 100b or 100d on which the capacitor electrodes 102 are provided.

Inductor electrodes 101 defining the inductors Ls of the shunt circuit 8b are provided on an insulating layer 100g, which is different from the insulating layers in which the shunt circuits 8a and 8c are provided, while capacitor electrodes 102 defining the capacitors Cs of the shunt circuit 8b are provided on insulating layers 100f and 100h immediately above and below the insulating layer 100g. The inductor electrodes 101 and the capacitor electrodes 102 defining the shunt circuit 8b are connected to each other by using via-conductors 103. Another insulating layer may be disposed between the insulating layer 100g on which the inductor electrodes 101 are provided and the insulating layer 100f or 100h on which the capacitor electrodes 102 are provided.

In this manner, by disposing the capacitor electrodes 102 immediately above and below the inductor electrodes 101, the spreading of magnetic fields of the inductors Ls defined by the inductor electrodes 101 is able to be significantly reduced or prevented by the capacitor electrodes 102, thus preventing unwanted coupling between the inductors Ls due to leakage flux.

A flat-shaped ground electrode 104 is provided on an insulating layer 100e between the insulating layer 100c on which the inductors Ls of the shunt circuits 8a and 8c are disposed and the insulating layer 100g on which the inductors Ls of the shunt circuit 8b are disposed. A flat-shaped ground electrode 104 is provided on an insulating layer 100a, which defines and functions a boundary with the upper portion of the multilayer substrate 100 in which the first and second filter circuits 5a and 5b are disposed. A flat-shaped ground electrode 104 is provided on an insulating layer 100i immediately above an insulating layer 100j, on the back surface of which the terminals 2a, 2b, 3a, and 3b and the GND terminals are provided.

Although it is not shown, in the upper portion of the multilayer substrate 100 in which the first and second filter circuits 5a and 5b are disposed, capacitor electrodes defining the capacitors C of the first and second filter circuits 5a and 5b are disposed on a layer lower than that on which inductor electrodes defining the inductors L of the first and second filter circuits 5a and 5b are disposed. As discussed above, the flat-shaped ground electrode 104 is provided on the insulating layer 100a, which defines and functions as a boundary between the lower portion of the multilayer substrate 100 in which the shunt circuits 8a, 8b, and 8c are disposed and the upper portion of the multilayer substrate 100 in which the first and second filter circuits 5a and 5b are disposed. Accordingly, since the capacitor electrodes are provided immediately above this ground electrode 104, the distance between the flat-shaped ground electrode 104 and the inductor electrodes defining the inductors L is able to be increased. It is thus possible to reduce signal loss which may occur in the inductors L defining the first and second filter circuits 5a and 5b caused by the ground electrode 104.

Frequency characteristics of the filter component 1 will be described below.

FIG. 4 is a graph illustrating frequency characteristics of the filter component 1. The horizontal axis indicates the frequency (GHz), and the vertical axis indicates the signal level (dB). In FIG. 4, the solid line indicates the transmission characteristic between the first differential input terminal 2a and the first differential output terminal 3a, while the broken line indicates the reflection characteristic of the first differential input terminal 2a. FIGS. 6, 8 through 10, 12, through 16, and 18, which will be referred to in a description below, may be explained in a similar manner, and thus, an explanation thereof will be omitted.

As shown in FIG. 4, in addition to a first attenuation pole located near 0.5 GHz, a second attenuation pole is located near 1.25 GHz. It is thus possible to effectively attenuate common mode noise in a frequency band near 1.25 GHz.

Comparative Example

Figure 5:
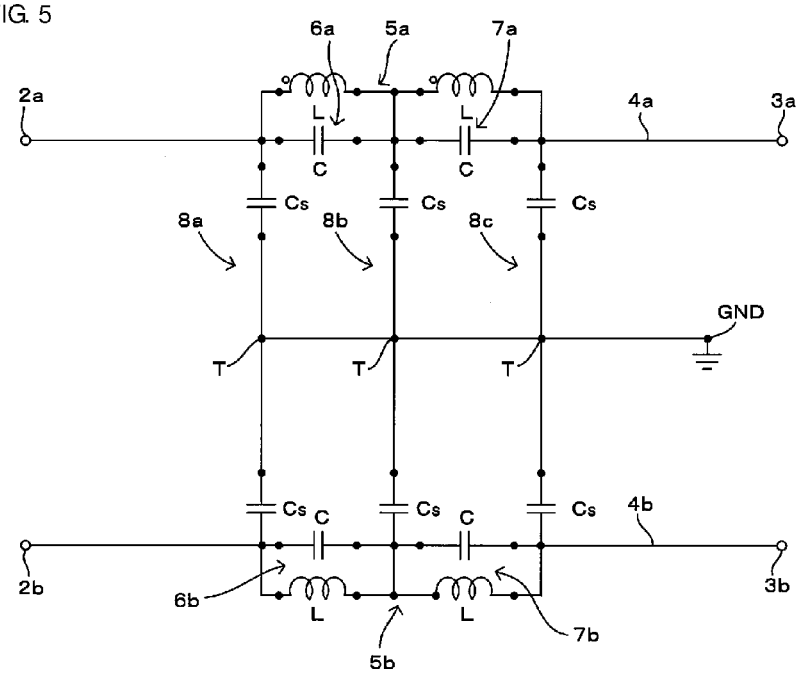
FIG. 5 is a circuit diagram of a comparative example.
Figure 6:
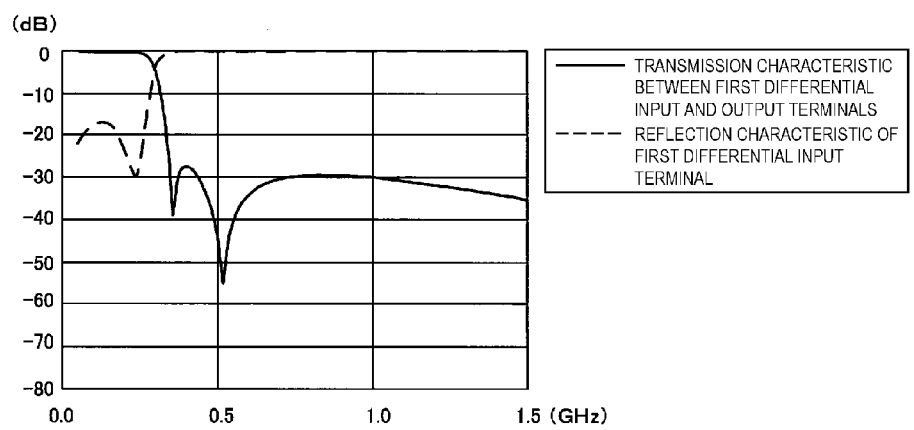
FIG. 6 is a graph illustrating frequency characteristics of the comparative example shown in FIG. 5.

A comparative example will be described below with reference to FIGS. 5 and 6. FIG. 5 is a circuit diagram of the comparative example, and FIG. 6 is a graph illustrating frequency characteristics of the comparative example shown in FIG. 5.

As shown in FIG. 5, in the comparative example, in each of the shunt circuits 8a, 8b, and 8c, inductors Ls are not provided, and only two capacitors Cs are connected in series with each other. As shown in FIG. 6, in the comparative example, although a first attenuation pole is located near 0.5 GHz, a second attenuation pole is not formed. Accordingly, the attenuation characteristics for common mode noise in the frequency band near 1.25 GHz are deteriorated.

As described above, in this preferred embodiment, the first line 4a between the first differential input terminal 2a and the first differential output terminal 3a and the second line 4b between the second differential input terminal 2b and the second differential output terminal 3b are connected to each other by the shunt circuits 8a, 8b, and 8c. Each of the shunt circuits 8a, 8b, and 8c includes the LC series resonance circuit 9a connected at one end to the first line 4a and the LC series resonance circuit 9b connected at one end to the other end of the LC series resonance circuit 9a and at the other end to the second line 4b. Each of the nodes T between the LC series resonance circuits 9a and 9b is grounded via the ground terminal GND. With this configuration, since each of the LC series resonance circuits 9a is connected at one end to the first line 4a and is grounded at the other end, it resonates reliably so as to provide an attenuation pole. Since each of the LC series resonance circuits 9b is grounded at one end and is connected at the other end to the second line 4b, it resonates reliably so as to provide an attenuation pole.

Accordingly, the resonant frequency of each of the LC series resonance circuits 9a and 9b is set to be a frequency that effectively attenuates common mode noise, thus making it possible to reliably attenuate common mode noise. Thus, the filter component 1 in which the attenuation characteristics for common mode noise are improved is provided. The LC series resonance circuits 9a and 9b resonate regardless of the grounding state of the node T between the LC series resonance circuits 9a and 9b. Accordingly, it is not necessary to set the node T at the midpoint of each of the shunt circuits 8a, 8b, and 8c, which is a virtual ground point. Hence, it is possible to significantly reduce or prevent variations in the resonant frequency of each of the LC series resonance circuits 9a and 9b caused by positional variations of the node T between the LC series resonance circuits 9a and 9b on each of the shunt circuits 8a, 8b, and 8c.

The node T is set at the midpoint of each of the shunt circuits 8a, 8b, and 8c, and the inductance of the inductor Ls of the LC series resonance circuit 9a and the inductance of the inductor Ls of the LC series resonance circuit 9b are identical to each other, thus making it possible to further enhance the effect of eliminating common mode noise in a predetermined frequency band. The inductors Ls also exhibit the effect of improving attenuation characteristics in an attenuation band for a differential mode signal, which is a signal that is allowed to pass through the filter component 1.

The first and second filter circuits 5a and 5b are disposed on one side of the multilayer substrate 100, while the ground electrodes 104 and the shunt circuits 8a, 8b, and 8c, on which the nodes T between the LC series resonance circuits 9a and 9b are grounded, are disposed on the other side of the multilayer substrate 100. With this configuration, the distance between the first and second filter circuits 5a and 5b and the ground electrodes 104 which ground the nodes T of the shunt circuits 8a, 8b, and 8c is able to be set as long as possible within the multilayer substrate 100. It is thus possible to reduce loss which may be caused by the interference of the ground electrodes 104 with magnetic fields generated by an RF signal (current) flowing through the first and second filter circuits 5a and 5b. Therefore, loss of a radio frequency (RF) signal passing through the filter component 1 is able to be significantly reduced or prevented.

Moreover, the filter component 1 having the following practical configuration is able to be provided. An LPF including the LC parallel resonance circuits 6a and 7a connected in series with each other is provided in the first filter circuit 5a. An LPF including the LC parallel resonance circuits 6b and 7b connected in series with each other is provided in the second filter circuit 5b.

The shunt circuit 8a is disposed between the previous stage of the LC parallel resonance circuit 6a and the previous stage of the LC parallel resonance circuit 6b. The shunt circuit 8b is disposed between the node between the LC parallel resonance circuits 6a and 7a and the node between the LC parallel resonance circuits 6b and 7b. The shunt circuit 8c is disposed between the subsequent stage of the LC parallel resonance circuit 7a and the subsequent stage of the LC parallel resonance circuit 7b. With this configuration, it is possible to adjust the attenuation characteristics for common mode noise with higher precision by using the three shunt circuits 8a, 8b, and 8c.

Among the three shunt circuits 8a, 8b, and 8c, the two inductors Ls of the shunt circuit 8b are disposed on the insulating layer 100g, which is different from the insulating layer 100c on which the inductors Ls of the shunt circuits 8a and 8c are provided. The flat-shaped ground electrode 104 is provided on the insulating layer 100e disposed between the insulating layer 100g on which the inductors Ls of the shunt circuit 8b are located and the insulating layer 100c on which the inductors Ls of the shunt circuits 8a and 8c are located. With this configuration, the inductors Ls of the shunt circuits 8a, 8b, and 8c are able to be disposed separately from each other in the in-plane direction of the insulating layer 100c or in the stacking direction of the multilayer substrate 100. This makes it possible to significantly reduce or prevent unwanted coupling between the inductors Ls and thus to reduce variations in the characteristics of the LC series resonance circuits 9a and 9b.

Second Preferred Embodiment

Figure 7:
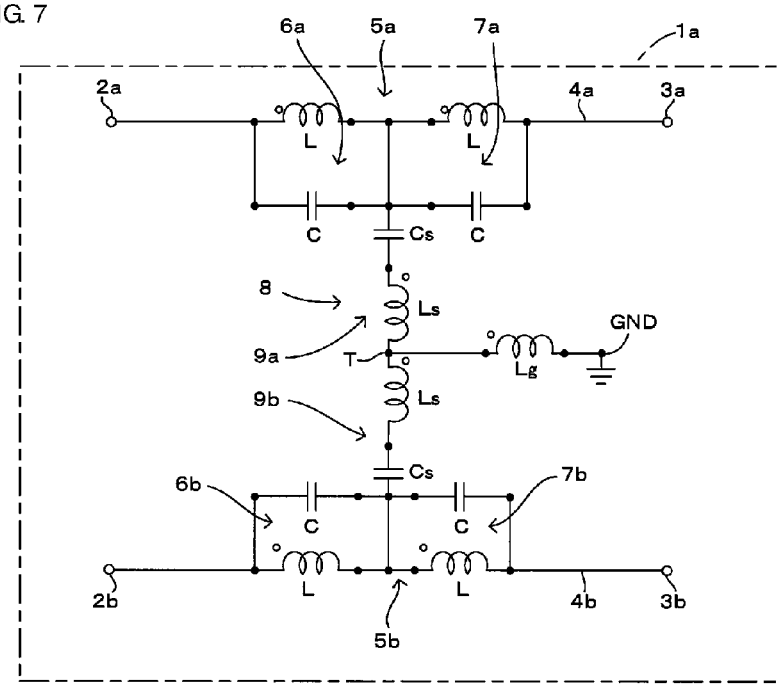
FIG. 7 is a circuit diagram of a filter component according to a second preferred embodiment of the present invention.
Figure 8:
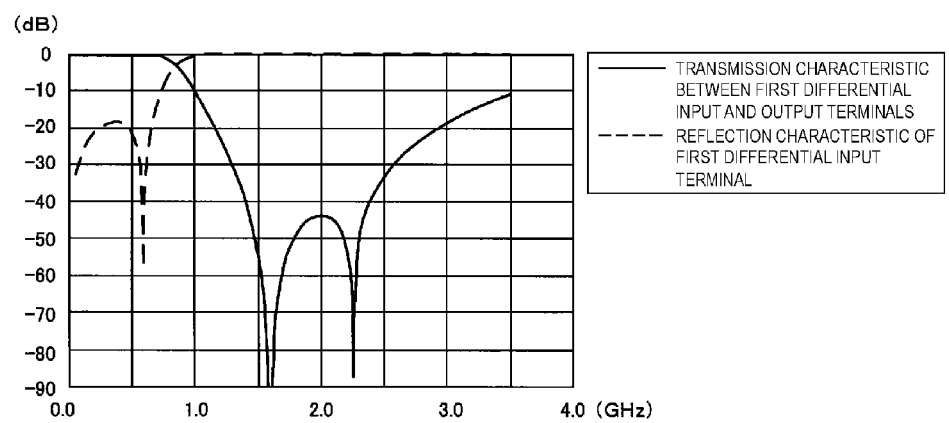
FIG. 8 is a graph illustrating frequency characteristics of the filter component shown in FIG. 7.

A second preferred embodiment of the present invention will be described below with reference to FIGS. 7 and 8. FIG. 7 is a circuit diagram of a filter component according to the second preferred embodiment of the present invention. FIG. 8 is a graph illustrating frequency characteristics of the filter component shown in FIG. 7.

A filter component 1a of this preferred embodiment differs from the filter component 1 shown in FIG. 1 in the following points. As shown in FIG. 7, a shunt circuit 8 which connects the first line 4a and the second line 4b with each other is disposed only between the node between the LC parallel resonance circuits 6a and 7a on the first line 4a and the node between the LC parallel resonance circuits 6b and 7b on the second line 4b. The node T between the LC series resonance circuits 9a and 9b of the shunt circuit 8 is grounded via an inductor Lg (corresponding to "a third inductor"). The configurations of the other elements are similar to those of the above-described first preferred embodiment, and thus, an explanation thereof will be omitted by designating the other elements of the second preferred embodiment by like reference numerals.

Frequency characteristics of the filter component 1a will be described below.

As shown in FIG. 8, in addition to a first attenuation pole located near 1.6 GHz, a second attenuation pole is located near 2.2 GHz. It is thus possible to effectively attenuate common mode noise in a frequency band near 2.2 GHz.

Modified Example

Figure 9:
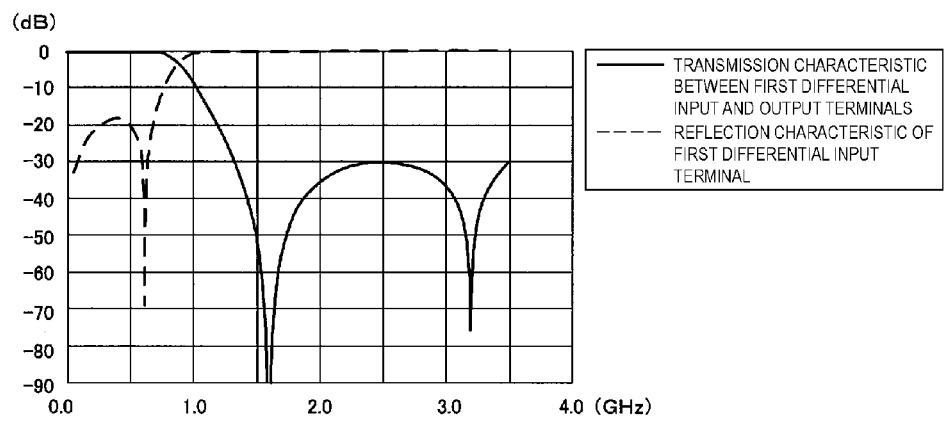
FIG. 9 is a graph illustrating an example of frequency characteristics of a modified example of the filter component shown in FIG. 7.
Figure 10:
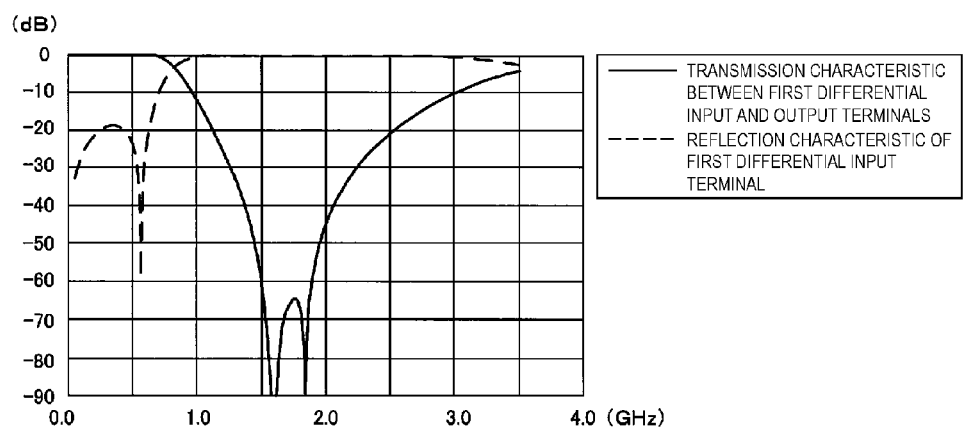
FIG. 10 is a graph illustrating another example of the frequency characteristics of the modified example of the filter component shown in FIG. 7.

A modified example of the filter component 1a will be described below with reference to FIGS. 9 and 10. FIG. 9 is a graph illustrating an example of frequency characteristics of a modified example of the filter component shown in FIG. 7. FIG. 10 is a graph illustrating another example of the frequency characteristics of the modified example of the filter component shown in FIG. 7.

As shown in FIG. 9, by decreasing the value of the inductors Ls of the LC series resonance circuits 9a and 9b of the shunt circuit 8, the second attenuation pole is provided at a higher frequency side, that is, near 3.2 GHz. As shown in FIG. 10, by increasing the value of the inductors Ls of the LC series resonance circuits 9a and 9b of the shunt circuit 8, the second attenuation pole is provided at a lower frequency side, that is, near 1.8 GHz.

Comparative Example

Figure 11:
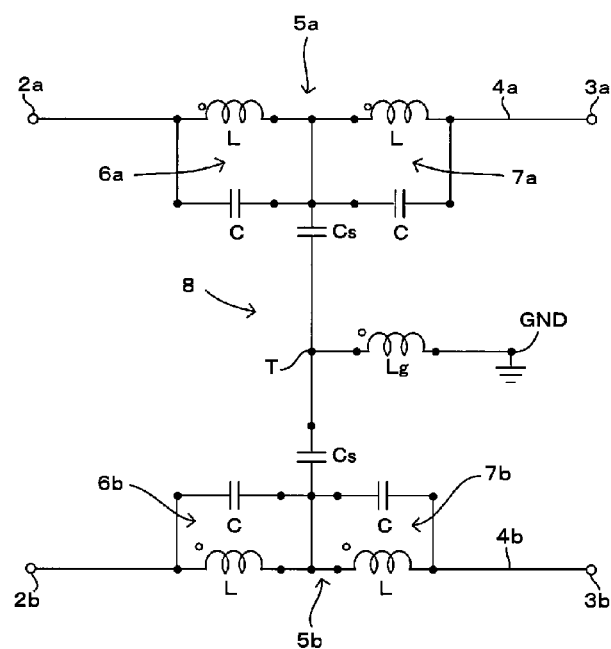
FIG. 11 is a circuit diagram of a comparative example.
Figure 12:
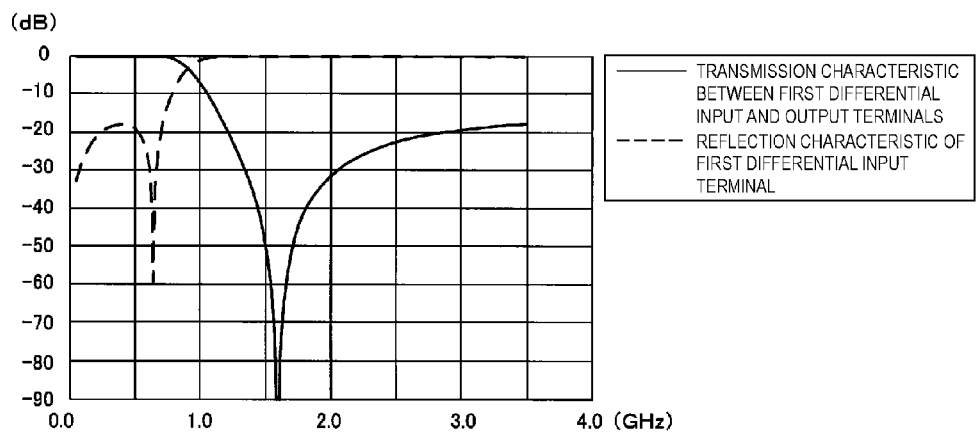
FIG. 12 is a graph illustrating frequency characteristics of the comparative example shown in FIG. 11.

A comparative example will be described below with reference to FIGS. 11 and 12. FIG. 11 is a circuit diagram of the comparative example, and FIG. 12 is a graph illustrating frequency characteristics of the comparative example shown in FIG. 11.

As shown in FIG. 11, in the shunt circuit 8 of the comparative example, inductors Ls are not provided, and only two capacitors Cs are connected in series with each other. As shown in FIG. 12, in the comparative example, although a first attenuation pole is located near 1.6 GHz, a second attenuation pole is not formed. Accordingly, unlike the second preferred embodiment and the modified example shown in FIGS. 8 through 10, the attenuation characteristics for common mode noise in the frequency bands near 1.8 GHz, 2.2 GHz, and 3.2 GHz are deteriorated.

As described above, in this preferred embodiment, the first and second LC series resonance circuits 9a and 9b of the shunt circuit 8 are grounded via the inductor Lg. Thus, the attenuation characteristics for common mode noise exhibited by the first and second LC series resonance circuits 9a and 9b are able to be adjusted with higher precision by the provision of the inductor Lg.

By adjusting the inductance value of the inductors Ls, the attenuation characteristics for common mode noise are able to be controlled as desired without influencing the transmission characteristic of an RF signal.

The parasitic resistance of the inductors Ls of the shunt circuit 8 may be set to be greater than that of the inductor Lg. By setting the parasitic resistance of the inductors Ls of the LC series resonance circuits 9a and 9b to be greater in this manner, the Q factor of each of the LC series resonance circuits 9a and 9b is decreased, thus making the resonance characteristics less sharp. It is thus possible to widen the frequency range of the attenuation characteristics for common mode noise near the attenuation poles provided by the LC series resonance circuits 9a and 9b.

Third Preferred Embodiment

Figure 13:
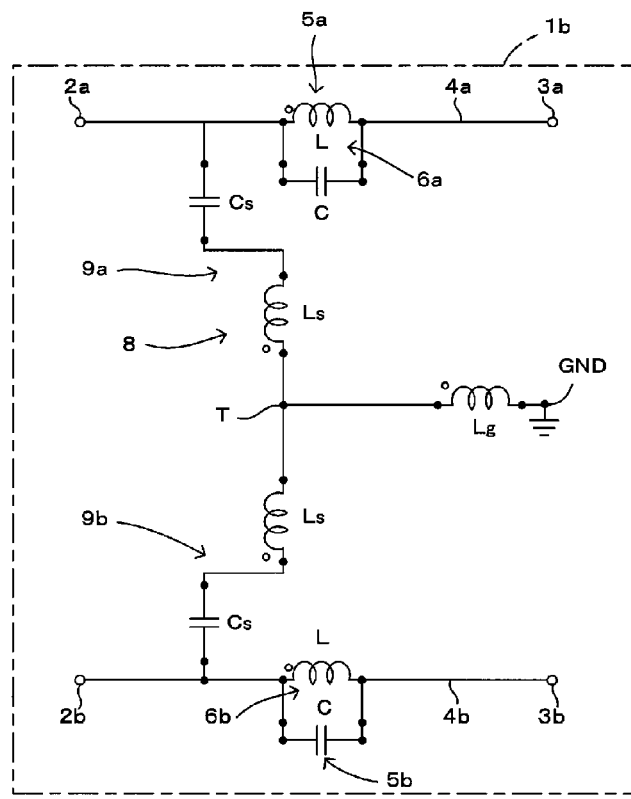
FIG. 13 is a circuit diagram of a filter component according to a third preferred embodiment of the present invention.
Figure 14:
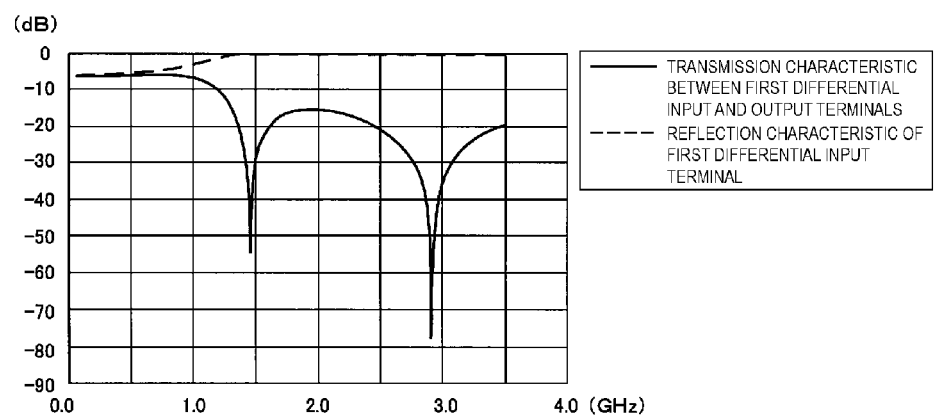
FIG. 14 is a graph illustrating frequency characteristics of the filter component shown in FIG. 13.

A third preferred embodiment of the present invention will be described below with reference to FIGS. 13 and 14. FIG. 13 is a circuit diagram of a filter component according to the third preferred embodiment of the present invention. FIG. 14 is a graph illustrating frequency characteristics of the filter component shown in FIG. 13.

A filter component 1b of this preferred embodiment differs from the filter component 1a shown in FIG. 7 in the following points. As shown in FIG. 13, in the first filter circuit 5a, a BEF is defined by a single LC parallel resonance circuit 6a, and in the second filter circuit 5b, a BEF is defined by a single LC parallel resonance circuit 6b. The shunt circuit 8 which connects the first line 4a and the second line 4b with each other is located between the previous stage of the LC parallel resonance circuit 6a and the previous stage of the LC parallel resonance circuit 6b. The configurations of the other elements are similar to those of the above-described second preferred embodiment, and thus, an explanation thereof will be omitted by designating the other elements of the third preferred embodiment by like reference numerals.

Frequency characteristics of the filter component 1b will be described below.

As shown in FIG. 14, in addition to a first attenuation pole located near 1.5 GHz, a second attenuation pole is located near 2.9 GHz. It is thus possible to effectively attenuate common mode noise in a frequency band near 2.9 GHz.

Modified Example

Figure 15:
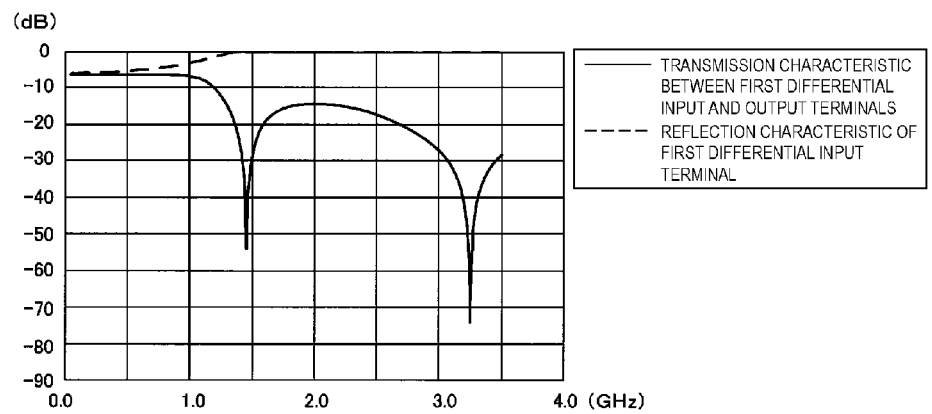
FIG. 15 is a graph illustrating an example of frequency characteristics of a modified example of the filter component shown in FIG. 13.
Figure 16:
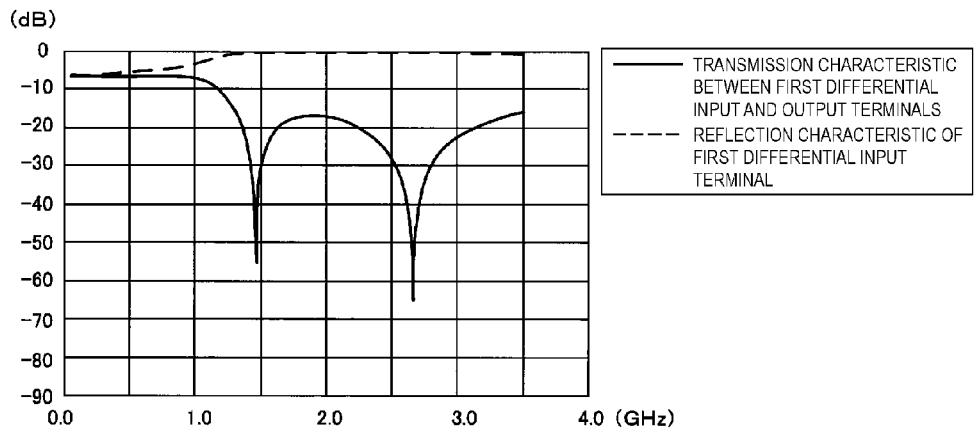
FIG. 16 is a graph illustrating another example of the frequency characteristics of the modified example of the filter component shown in FIG. 13.

A modified example of the filter component 1b will be described below with reference to FIGS. 15 and 16. FIG. 15 is a graph illustrating an example of frequency characteristics of a modified example of the filter component shown in FIG. 13. FIG. 16 is a graph illustrating another example of the frequency characteristics of the modified example of the filter component shown in FIG. 13.

As shown in FIG. 15, by decreasing the value of the inductors Ls of the LC series resonance circuits 9a and 9b of the shunt circuit 8, the second attenuation pole is located at a higher frequency side, that is, near 3.2 GHz. As shown in FIG. 16, by increasing the value of the inductors Ls of the LC series resonance circuits 9a and 9b of the shunt circuit 8, the second attenuation pole is located at a lower frequency side, that is, near 2.7 GHz.

Comparative Example

Figure 17:
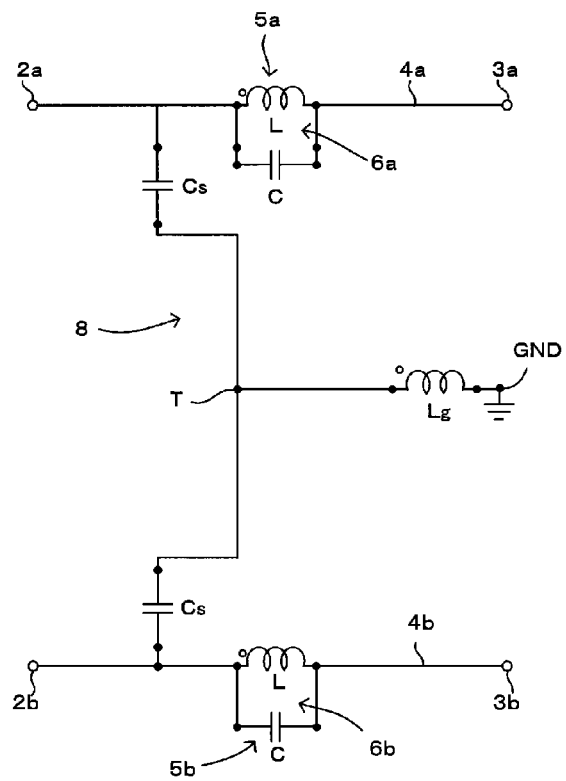
FIG. 17 is a circuit diagram of a comparative example.
Figure 18:
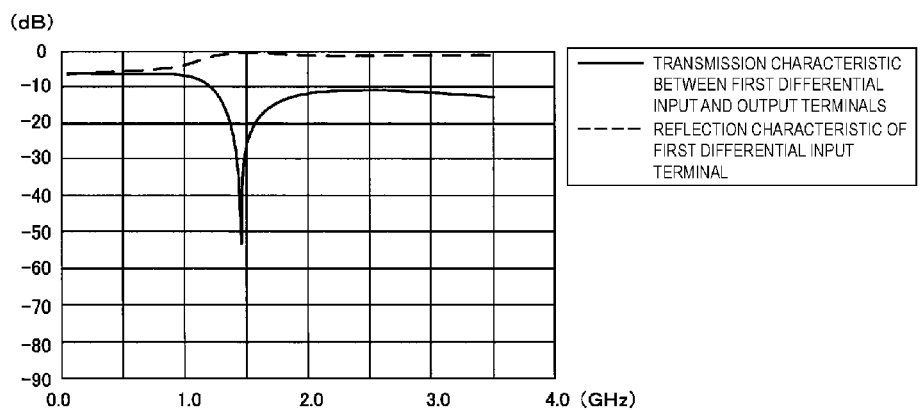
FIG. 18 is a graph illustrating frequency characteristics of the comparative example shown in FIG. 17.
Figure 19:
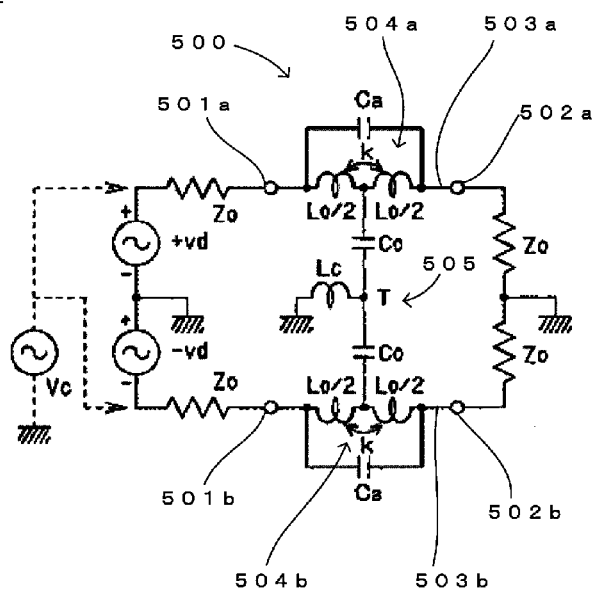
FIG. 19 is a circuit diagram of a known filter component.

A comparative example will be described below with reference to FIGS. 17 and 18. FIG. 17 is a circuit diagram of the comparative example, and FIG. 18 is a graph illustrating frequency characteristics of the comparative example shown in FIG. 17.

As shown in FIG. 17, in the shunt circuit 8 of the comparative example, inductors Ls are not provided, and only two capacitors Cs are connected in series with each other. As shown in FIG. 18, in the comparative example, although a first attenuation pole is located near 1.5 GHz, a second attenuation pole is not formed. Accordingly, unlike the third preferred embodiment and the modified example shown in FIGS. 14 through 16, the attenuation characteristics for common mode noise in the frequency bands near 2.7 GHz, 2.9 GHz, and 3.2 GHz are deteriorated.

As described above, in this preferred embodiment, the filter component 1 having the following practical configuration is able to be provided. A BEF defined by the LC parallel resonance circuit 6a is provided in the first filter circuit 5a, and a BEF defined by the LC parallel resonance circuit 6b is provided in the second filter circuit 5b.

The present invention is not restricted to the above-described preferred embodiments. Various modifications other than those described above may be made without departing from the spirit of the present invention, and the above-described configurations may be combined in any manner. For example, in each of the shunt circuits 8a, 8b, and 8c, the node T between the LC series resonance circuits 9a and 9b may not necessarily be set at the midpoint of each of the shunt circuits 8a, 8b, and 8c.

The inductor electrodes 101 defining the inductors Ls and Lg may be located at positions at which they are not superposed on each other within the multilayer substrate 100, as viewed from above. With this arrangement, it is possible to prevent the occurrence of unwanted capacitance components among the inductors Ls and Lg, thus improving the design accuracy of the attenuation poles in the filter component 1.

The inductance values of the inductors L, Ls, and Lg defining the corresponding circuits and the capacitance values of the capacitors C and Cs defining the corresponding circuits may be set suitably in accordance with the required frequency characteristics of a filter component.

Preferred embodiments of the present invention are widely applicable to filter components having a function of eliminating common mode noise which propagates through differential lines.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter component comprising:
   first and second differential input terminals;
   first and second differential output terminals;
   a first filter circuit that is disposed on a first line between the first differential input terminal and the first differential output terminal;
   a second filter circuit that is disposed on a second line between the second differential input terminal and the second differential output terminal;
   a shunt circuit that connects the first line and the second line with each other; and
   a multilayer substrate including a plurality of insulating layers stacked on each other, the first and second filter circuits and the shunt circuit being disposed in the multilayer substrate; wherein
   the first and second filter circuits are disposed on a first side of the multilayer substrate, and the shunt circuit is disposed on a second side of the multilayer substrate;
   the first filter circuit includes a first LC parallel resonance circuit;
   the second filter circuit includes a second LC parallel resonance circuit;
   the shunt circuit includes:
      a first LC series resonance circuit that is connected at a first end thereof to the first line; and
      a second LC series resonance circuit that is connected at a first end thereof to a second end of the first LC series resonance circuit and connected at a second end thereof to the second line; wherein
   a node between the first and second LC series resonance circuits is grounded;
   the node is located at a midpoint of the shunt circuit; and
   an inductance of a first inductor included in the first LC series resonance circuit and an inductance of a second inductor included in the second LC series resonance circuit are identical to each other.

2. The filter component according to claim 1, wherein the shunt circuit which connects the first line and the second line with each other is disposed only between a node between LC parallel resonance circuits including the first LC parallel resonant circuit of the first filter circuit of the first line and a node between LC parallel resonance circuits including the second LC parallel resonant circuit of the second filter circuit of the second line.

3. The filter component according to claim 1, wherein the first filter circuit includes a band elimination filter including the first LC parallel resonance circuit, and the second filter circuit includes a band elimination filter including the second LC parallel resonance circuit.

4. The filter component according to claim 3, wherein the shunt circuit is disposed between a node between the first differential input terminal and the first LC parallel resonance circuit and a node between the second differential input terminal and the second LC parallel resonance circuit.

5. The filter component according to claim 1, wherein the first filter circuit includes the first LC parallel resonance circuit and a third LC parallel resonance circuit connected in series with the first LC parallel resonance circuit; and the second filter circuit includes the second LC parallel resonance circuit and a fourth LC parallel resonance circuit connected in series with the second LC parallel resonance circuit.

6. The filter component according to claim 5, further comprising:
   three locations; wherein
   a respective shunt circuit is disposed at each of the three locations, the three locations including:
      between a node between the first differential input terminal and the first LC parallel resonance circuit and a node between the second differential input terminal and the second LC parallel resonance circuit;
      between a node between the first and third LC parallel resonance circuits and a node between the second and fourth LC parallel resonance circuits; and
      between a node between the third LC parallel resonance circuit and the first differential output terminal and a node between the fourth LC parallel resonance circuit and the second differential output terminal.

7. The filter component according to claim 6, wherein the first and second inductors of the shunt circuit at one of the three locations are disposed on a first of the plurality of insulating layers that is different from a second of the plurality of insulating layers on which the first and second inductors of the other shunt circuits are disposed, and a flat-shaped ground electrode is disposed on a third of the plurality of insulating layers disposed between the first insulating layer and the second insulating layer.

8. The filter component according to claim 1, wherein the node is grounded via a third inductor.

9. The filter component according to claim 8, wherein parasitic resistance of the first and second inductors is greater than parasitic resistance of the third inductor.

10. The filter component according to claim 1, wherein each of the first and second LC parallel resonance circuits includes an inductor and a capacitor connected in parallel with each other.

11. The filter component according to claim 1, wherein each of the first and second filter circuits includes a low pass filter.

12. The filter component according to claim 1, wherein the shunt circuit includes inductor electrodes which are provided on a first insulating layer of the plurality of insulating layers and the shunt circuit includes capacitor electrodes which are provided on second and third insulating layers of the plurality of insulating layers immediately above and below the first insulating layer.

13. The filter component according to claim 1, wherein the shunt circuit includes inductor electrodes which are provided on a first insulating layer of the plurality of insulating layers and the shunt circuit includes capacitor electrodes which are provided on second and third insulating layers of the plurality of insulating layers above and below the first insulating layer with a fourth insulating layer of the plurality of insulating layers disposed therebetween.

14. The filter component according to claim 1, further comprising:
   at least three of the shunt circuit; wherein
   the at least three shunt circuits are disposed in the multilayer substrate; and
   a plurality of ground electrodes and the at least three shunt circuits are disposed on the second side of the multilayer substrate.

* * * * *